US007335288B2

(12) United States Patent
Hardikar

(10) Patent No.: US 7,335,288 B2
(45) Date of Patent: *Feb. 26, 2008

(54) METHODS FOR DEPOSITING COPPER ON A NOBLE METAL LAYER OF A WORK PIECE

(75) Inventor: Vishwas V. Hardikar, Phoenix, AZ (US)

(73) Assignee: Novellus Systems, Inc., San Jose, CA (US)

( * ) Notice: Subject to any disclaimer, the term of this patent is extended or adjusted under 35 U.S.C. 154(b) by 807 days.

This patent is subject to a terminal disclaimer.

(21) Appl. No.: 10/666,432

(22) Filed: Sep. 18, 2003

(65) Prior Publication Data

US 2005/0061679 A1    Mar. 24, 2005

(51) Int. Cl.
*C25D 3/38* (2006.01)
(52) U.S. Cl. .................... 205/93; 205/123; 205/296
(58) Field of Classification Search ................ 205/93, 205/123, 296
See application file for complete search history.

(56) References Cited

U.S. PATENT DOCUMENTS

| | | | | |
|---|---|---|---|---|
| 5,525,207 A * | 6/1996 | Becking | ...................... | 205/244 |
| 6,261,433 B1 * | 7/2001 | Landau | ........................ | 205/96 |
| 6,610,192 B1 * | 8/2003 | Step et al. | ................... | 205/297 |
| 6,942,780 B2 * | 9/2005 | Basol et al. | ................. | 205/137 |
| 6,974,771 B2 * | 12/2005 | Chen et al. | ................. | 438/637 |
| 7,105,082 B2 * | 9/2006 | Hardikar | ..................... | 205/261 |
| 7,220,451 B2 * | 5/2007 | Aaltonen et al. | ...... | 427/255.29 |

OTHER PUBLICATIONS

"Electrodeposition of Copper Thin Film on Ruthenium—A Potential Diffusion Barrier for CU Interconnects", Oliver Chyan et al.,*Journal of The Electrochemical Society*, vol. 150, No. 5 (2003).
"Seedless Superfill: Copper Electrodeposition in Trenches with Ruthenium Barriers", D. Josell et al.,*Electrochemical and Solid State Letters*, Jun. 5, 2003.
"Linear Materials for Direct Electrodeposition of Cu", M.W.Lane et al., *Applied Physics Letter*, vol. 83, No. 12, Sep. 22, 2003.
"*International Technology Roadmap for Semiconductors*", 2001.

* cited by examiner

*Primary Examiner*—Susy Tsang-Foster
*Assistant Examiner*—William T. Leader
(74) *Attorney, Agent, or Firm*—Ingrassia Fisher & Lorenz, P.C.

(57) ABSTRACT

Methods for electrodeposition of copper on a noble metal layer of a work piece are provided. An exemplary method includes exposing the noble metal layer to an electrodeposition composition. The electrodeposition composition comprises a copper salt, a suppressor, an accelerator and an electrolyte. The electrodeposition of copper on a surface of the noble metal layer is initiated by application of a predetermined current density to the work piece. The electrodeposition of copper is terminated upon the occurrence of a predetermined event.

17 Claims, 2 Drawing Sheets

US 7,335,288 B2

METHODS FOR DEPOSITING COPPER ON A NOBLE METAL LAYER OF A WORK PIECE

TECHNICAL FIELD

The present invention generally relates to electrodeposition of a metal, and more particularly relates to electrodeposition of copper on a noble metal layer of a work piece.

BACKGROUND

The production of integrated circuits begins with the creation of high-quality semiconductor wafers. During the wafer fabrication process, the wafers may undergo multiple dielectric and conductor deposition processes followed by the masking and etching of the deposited layers. Some of these steps relate to metallization, which generally refers to the materials, methods and processes of wiring together or interconnecting the component parts of an integrated circuit located on or overlying the surface of the wafer. Typically, the "wiring" of an integrated circuit involves etching features, such as trenches and "vias," in a planar dielectric (insulator) layer and filling the features with a conductive material, typically a metal.

In the past, aluminum was used extensively as a metallization material in semiconductor fabrication due to ease with which aluminum could be applied and patterned and due to the leakage and adhesion problems experienced with the use of gold. Other metallization materials have included such materials as Ni, Ta, Ti, W, Ag, Cu/Al, TaN, TiN, CoWP, NiP and CoP, alone or in various combinations.

Recently, techniques have been developed which utilize copper to form conductive contacts and interconnects because copper is less susceptible to electromigration and exhibits a lower resistivity than aluminum. Since copper does not readily form volatile or soluble compounds, the patterned etching of copper is difficult, and the copper conductive contacts and interconnects are therefore often formed using a damascene process. In accordance with the damascene process, the copper conductive contacts and interconnects are usually formed by creating a via within an insulating material. A barrier layer, which serves to prevent catastrophic contamination caused by copper diffusing through the interlayer dielectrics, is deposited onto the surface of the insulating material and into the via. Because it is often difficult to form a copper metallization layer overlying the barrier layer, a seed layer of copper is deposited onto the barrier layer. Then, a copper metallization layer is electrodeposited onto the seed layer to fill the via The excess copper metallization layer, the copper seed layer, and the barrier layer overlying the insulating material outside the via are then removed, for example by a process of chemical mechanical planarization or chemical mechanical polishing, each of which will hereafter be referred to as chemical mechanical planarization or CMP.

Barrier layers formed of tantalum (Ta) and tantalum nitride (TaN) currently are used to contain copper interconnects. However, it is difficult to deposit copper effectively onto thin barrier layers of Ta/TaN because the layers generally are too resistive, especially in high-aspect-ratio features. In addition, it is difficult to fill high-aspect ratio features with copper due to the occurrence of copper voids. Poor sidewall coverage and large overhang surrounding the features cause the copper electrofill to close off and leave void defects in the features. As integrated circuits continue to scale to 90 nm nodes, 65 nm nodes, 45 nm nodes and smaller, it may become difficult to further decrease the dimensions of the Ta/TaN/Cu trilayer in higher-aspect ratio features. Barrier layers formed of ruthenium may present a desirable alternative to Ta/TaN barriers. Ruthenium is an air-stable transition metal with a high melting point and is nearly twice as thermally and electrically conductive as tantalum. In addition, ruthenium, like tantalum, generally shows negligible solid solubility with copper.

As the size of integrated circuit components continues to decrease and the density of microstructures on integrated circuits increases, the feature sizes found on an integrated circuit can vary widely from, for example, less than 100 nanometers (nm) to more than 1 micrometer (µm). Such features are generally spaced apart by otherwise substantially planar field regions. Filling the wide variety of features is difficult. To fill wide features with copper, it is often necessary to deposit relatively thick layers of copper, typically 7000 angstroms and greater, over the field regions of the wafer. A subsequent planarization process then is required to remove the deposited barrier layer, the copper seed layer and the thick excess deposited copper layer, to electrically isolate the copper in spaced apart features, and to level the surface for subsequent steps in the integrated circuit manufacturing process. Deposition of thick layers of copper followed by a planarization process to subsequently remove the thick excess copper layer increases the cost of the electrodeposition process and decreases throughput. In addition, it is difficult to deposit copper in small features without experiencing conformal defects.

Accordingly, it is desirable to provide an improved method for electrodeposition of copper on a work piece. It is also desirable to provide a method for electrodeposition of a thin copper film on a work piece. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The invention disclosed and claimed herein is applicable to the deposition of metal onto a surface of a variety of work pieces, but will be described and illustrated with reference to only a single illustrative work piece, namely a semiconductor wafer having an insulative layer deposited thereon. Although the invention is illustrated with reference to its application only to one particular work piece and to one particular metal deposited on that work piece, it is not intended that the invention be limited to that particular application.

In particular, the present invention is directed to a method for electrodeposition of copper on a work piece. As used herein, unless otherwise specified, the term electrodeposition includes both the processes of electroplating and electrochemical mechanical deposition, also known as planar deposition. Electroplating typically involves conventional metal deposition using an electrolyte solution containing a metal, an anode and a cathode. A polishing step, typically a chemical mechanical polishing step, may be performed after deposition to obtain a planar surface of desired thickness. Electrochemical mechanical deposition uses a dedicated apparatus that selectively deposits the metal on the work piece to obtain a planar metal surface of a desired thickness.

Figure 1:
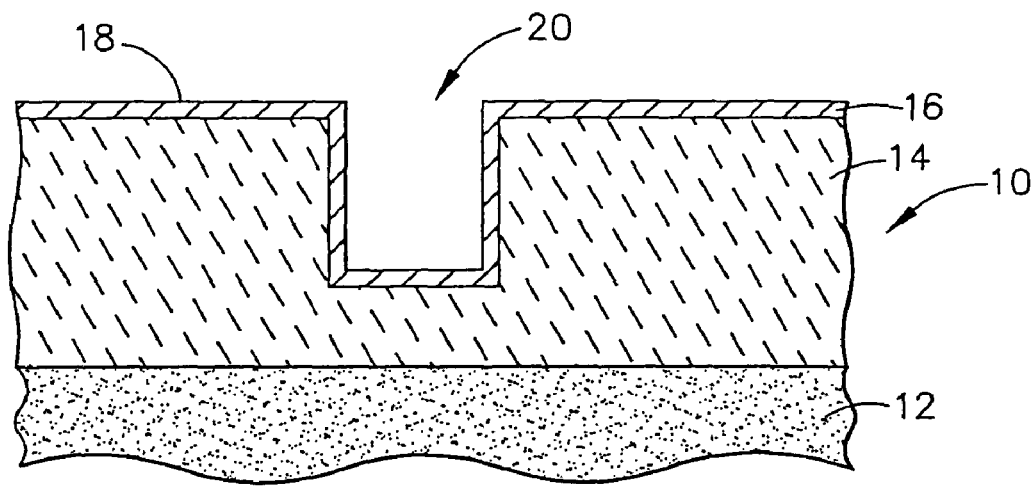
FIG. 1 is a cross-sectional view of a portion of a work piece having a noble metal barrier layer formed thereon.

In accordance with various embodiments of the present invention, the methods of electrodeposition of copper on a work piece include the electrodeposition of copper onto a work piece 10, such as that illustrated in FIG. 1, that typically includes a semiconductor substrate 12, which can be a silicon substrate. A layer of insulating material 14 overlies substrate 12. The insulating layer may be a single layer of insulating material or may be composed of a plurality of layers of insulating material, not all of which are necessarily the same material. The layer of insulating material 14 may be or may include, for example, silicon dioxide, silicon nitride, or any of the other insulating materials commonly used in the fabrication of semiconductor devices. In accordance with one embodiment of the invention, the layer of insulating material may include a layer of low-k dielectric material such as those formed by spin-on deposition from, for example, an organic source material comprising polyimide, silicon sesquioxane, siloxane, or the like. By low-k dielectric material is meant a material having a dielectric constant less than about 3.9. The work piece 10 may also have a field region 18 that is adjacent to a feature 20. As used herein, a feature is any sub-surface element, character or surface such as, but not limited to, a via or trench formed within the layer of insulating material. The features can be formed by conventional photolithographic and etching techniques. The surface of layer 14 surrounding feature 20 is called the field region 18. Field region 18 is any adjacent element, character or surface that is elevated with respect to the features. The field region is generally, but not necessarily, substantially planar in contrast to the features. Features formed during the processing of a semiconductor work piece can be of varying sizes, such as those having widths ranging from less than 100 nm to widths of 1-2 μm or larger.

Overlying the layer of insulating material is a barrier layer 16 formed of a noble metal layer. Barrier layer 16 can be formed by physical vapor deposition, chemical vapor deposition or atomic layer deposition to a thickness of, for example, about 40 nm or less. In a preferred embodiment of the present invention, barrier layer 16 may be formed of ruthenium, rhodium, palladium, osmium, iridium or platinum. In a more preferred embodiment of the present invention, barrier layer 16 is formed of ruthenium. The noble metal barrier layer serves to retard the migration into the insulating material layer of copper from a subsequently formed copper layer. The noble metal barrier layer also may serve as a seed layer to facilitate the growth of a subsequently formed copper layer. In addition, the noble metal barrier layer may exhibit suitable adhesion to insulating material layer 14 and thus be able to withstand delamination from layer 14 upon electrochemical mechanical deposition or CMP. In one embodiment of the invention, the noble metal barrier layer is deposited to a thickness of no greater than 400 angstroms. In a preferred embodiment of the invention, the noble metal barrier layer is deposited to a thickness of no greater than 100 angstroms.

Figure 2:
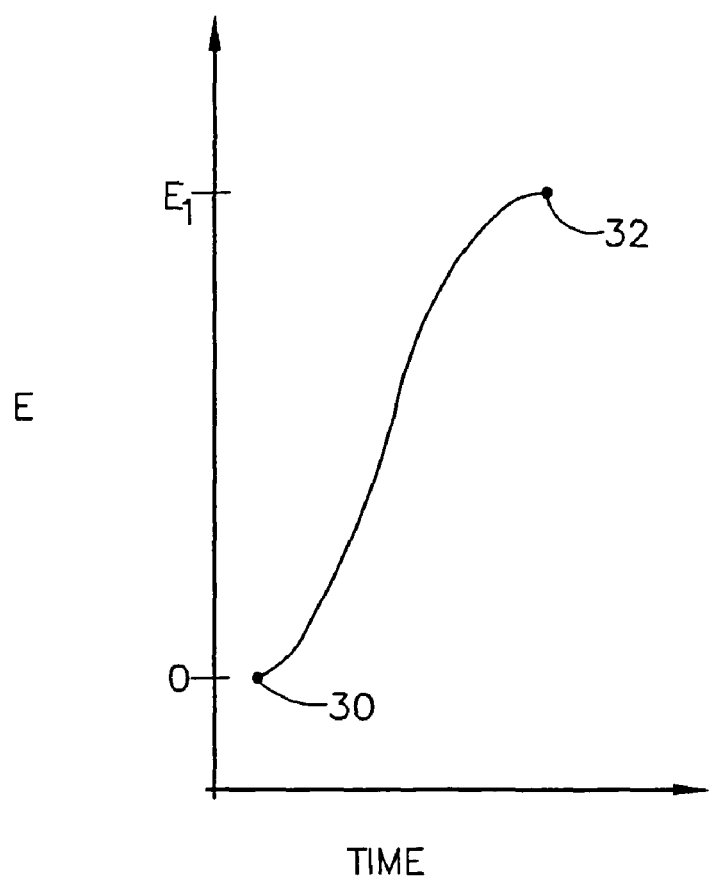
FIG. 2 is a graph illustrating the change in the electronic energy of the surface of the noble metal layer to accomplish copper deposition.

Methods for electrodeposition of copper overlying the noble metal barrier layer, in accordance with the various embodiments of the present invention, include activating the noble metal barrier layer to facilitate copper electrodeposition. In accordance with one embodiment of the present invention, the noble metal barrier layer may be activated by modifying the electronic energy of the surface of the noble metal barrier layer for copper electrodeposition. FIG. 2 is a graph that qualitatively illustrates the change in the electronic energy of the surface of the noble metal barrier layer to accomplish copper deposition. At point 30, the electronic energy of the noble metal barrier layer is at its elemental state and copper deposition does not occur. At point 32, the electronic energy of the noble metal barrier layer has changed by an electronic energy difference of $E_1$, at which point copper deposits on the noble metal layer.

In accordance with one embodiment of the present invention, the electronic energy of the noble metal barrier layer may be modified for copper electrodeposition by subjecting the noble barrier layer to a current density in the presence of an electrodeposition composition, such as the electrodeposition composition disclosed in the copending, commonly assigned U.S. application Ser. No. 10/377,488, filed Feb. 27, 2003, the disclosure of which is herein incorporated in its entirety by reference. Using this method, copper may be deposited onto the noble metal barrier layer to any suitable thickness overlying the field regions, preferably no greater than 3000 angstroms. In a preferred embodiment of the invention, the noble metal barrier layer is subjected to a low current density. As used herein, the term "low current density" shall mean current densities approximately no greater than 40 mAmps/cm$^2$, preferably approximately no greater than 20 mAmps/cm$^2$.

The electrodeposition composition suitably comprises a metal salt, at least one polymer suppressor and an accelerator. The composition also comprises an electrolyte, preferably an acidic aqueous solution, such as, for example, a sulfuric acid solution. The composition also may contain a variety of other components, such as, for example, one or more leveler agents.

In accordance with an exemplary embodiment of the present invention, the composition may also comprise an anion. It will be appreciated that the suppressor, being a polymer component, has a cloud point. Cloud point is defined as the temperature at which phase separation occurs for a 1% polymer solution The electrodeposition is conducted at an electrodeposition temperature selected so that deposition of a metal on the work piece may occur. Typically, electrodeposition is conducted at temperatures in the range of about 15 to 40° C., although it will be appreciated that electrodeposition may occur at any suitable temperature. If the cloud point of the polymer suppressor is greater than the electrodeposition temperature, the composition may comprise an anion present in an amount sufficient to lower the cloud point to a temperature approximately no greater than the electrodeposition temperature.

By decreasing the cloud point of the polymer suppressor to a temperature no greater than the electrodeposition temperature, phase separation of the polymeric suppressor from solution and hence its adsorption onto the work piece is achieved. Without intending to be bound by theory, it is believed that the solubility of the suppressor decreases as the addition of anion increases. As the solubility of the suppressor decreases, the adsorption of the suppressor onto sites of nucleation increases. Since the mechanism of action of the polymeric suppressor molecule is the suppression or inhibition of metal deposition by adsorption of the suppressor molecule onto sites of nucleation, suppression increases as solubility of the polymer suppressor decreases.

In an alternative embodiment, a polymer suppressor having a cloud point that matches the electrodeposition temperature may be selected so that addition of an anion is unnecessary. In yet another alternative embodiment, a polymer suppressor having a particular cloud point may be selected and the electrodeposition temperature may be matched to the suppressor's cloud point. As used herein, two temperatures "match" each other when they differ by no more than 0.5° C.

Further, it will be appreciated that by selecting a polymer suppressor with a cloud point close to the electrodeposition temperature, only an amount of anion needed to lower the cloud point to a temperature no greater than the electrodeposition temperature is required. Limiting the amount of anion added to the composition may be desirable, as high concentrations of anions can be corrosive.

In one exemplary embodiment of the present invention, the anion comprises any suitable anion that is polarizable in an electric field. In a preferred embodiment, the anion comprises chloride ions, bromide ions, iodide ions and sulfate ions or a combination thereof. The anion concentration is typically within the range of 2-200 ppm.

In accordance with another exemplary embodiment of the present invention, the electrodeposition composition may be formulated such that the rate of deposition of the copper within the features is greater than the rate of deposition of the copper on the field regions, even for features that are 2 µm wide and larger. As used herein, the rate of deposition is defined as the amount of copper deposited per unit of time, which for a known substrate area and copper density translates into thickness deposited per time, i.e., angstroms per minute.

In another exemplary embodiment of the present invention, the suppressor of the electrodeposition composition may suitably comprise any polymer suppressor formulated for preferential adsorption on the field regions of the work piece, even on field regions next to relatively large features, that is, features no less than 2 µm in width. Polymer suppressors of the present invention are large molecules when compared to the molecules of the accelerators of the present invention and are electroinactive. Without intending to be bound by theory, and as discussed in more detail below, it is believed that the polymer suppressors of the present invention exhibit preferential adsorption on the field regions of the work piece, even on field regions next to relatively large features, because the adsorption efficiency of the suppressors of the present invention is less than the adsorption efficiency of the accelerators of the present invention. As used herein, adsorption efficiency is defined as the rate of adsorption divided by the rate of desorption.

In accordance with a further exemplary embodiment of the invention, the electrodeposition composition of the present invention may be formulated so that the amount of overburden overlying the field regions is reduced or eliminated. "Overburden" is defined as the thickness of a deposited metal overlying a field region This "single-step" electrodeposition thus eliminates the need or at least reduces the time needed for subsequent processing steps, such as wet etching, chemical mechanical planarization, reverse polarity etching and the like, to remove excessive overburden. In one embodiment of the invention, the electrodeposition composition of the present invention may be formulated such that when the deposited copper metallization layer is substantially planar overlying the work piece, the copper overburden overlying a field region is no greater than about 3000 angstroms.

The electrodeposition composition of the present invention also may be formulated so that a copper metallization layer having a substantially planar surface may be deposited on a work piece without the need for subsequent processing steps, such as wet etching, chemical mechanical planarization, reverse polarity etching and the like. As used herein, a "substantially planar" surface means a surface having no step height greater than 1000 angstroms. As used herein, step height is the distance between a plane of a surface of a deposited metal layer overlying a field region of a work piece and a plane of a surface of the deposited metal layer overlying a feature. Preferably, the step height is no greater than 500 angstroms.

It will further be appreciated that the electrodeposition composition of the present invention may comprise two or more polymer suppressors of varying molecular sizes. As described above, polymer suppressors are typically large molecules. Since these molecules may be larger than the size of some features in the work piece, their diffusion into the smaller-size features is limited. Thus, deposition occurs at a faster rate in the smaller-size features than in those features in which the polymer suppressor molecules are able to diffuse. Accordingly, in this exemplary embodiment, the electrodeposition composition of the present invention may comprise polymer suppressors of varying average molecular size to accommodate features of varying geometries to facilitate planar deposition.

In a further exemplary embodiment of the present invention, the suppressor may comprise any suitable polymer suppressor that serves as a wetting agent. Acting as a wetting agent, the polymer suppressor permits faster spreading of the composition on the seed and/or barrier layer overlying the work piece. Thus, in small features, where typically voids may result without the presence of a wetting agent, the polymer suppressor is present in an amount sufficient to wet the walls of the feature but, because of its large molecular size, is not present in an amount sufficient to suppress deposition In one embodiment of the invention, the polymer suppressor has a Draves wetting value in the range of 1 to 30 seconds. Draves wetting value is defined as the time required for a piece of waxed cotton yarn to sink to the bottom of a 1% concentration solution at 25° C. In a preferred embodiment of the invention, the polymer suppressor of the composition has a Draves wetting value in the range of 1 to 15 seconds. In another embodiment of the invention, the polymer suppressor has contact angle in the range of 0 to 60° as measured for up to 1 minute. In a further embodiment of the invention, the polymer suppressor has a hydrophilic/lipophilic balance (HLB) value in the range of 1 to 15.

Suitable polymer suppressors in accordance with the various embodiments of the present invention may comprise any polymer that is soluble in water and has a molecular weight in the range of from 1000 to 2 million. In a preferred embodiment of the invention, the polymer suppressors comprise block copolymers of ethylene oxide and propylene oxide. Examples of block copolymers of ethylene oxide and propylene oxide that may be used in the compositions of the present invention include Pluronic®, Pluronic® R, Tetronic®, and Tetronic® R surfactants manufactured by BASF Corporation of Mount Olive, N.J. In a preferred embodiment of the invention, the polymer suppressors of the present invention comprise one or more of the surfactants Pluronic®, L62, L72, L92, L122, 17R1, 25R1, 25R2, 31R1 and 31R2. The polymer suppressor portion of the electrodeposition composition typically comprises 0.001 to 10% by weight.

In one embodiment of the invention, the polymer suppressors have cloud points in the range of about 10 to 100° C. In a preferred embodiment of the invention, the polymer suppressors have cloud points in the range of about 15 to 40° C. In a more preferred embodiment of the invention, the polymer suppressors have cloud points in the range of about 19 to 25° C.

In accordance with another exemplary embodiment of the invention, the accelerator may be formulated for preferential adsorption on the features of the work piece, even relatively large features, that is, features no less than 2 μm in width. Without intending to be bound by theory, it is believed that a number of factors may be responsible for this phenomenon. Accelerators of the present invention are small molecules when compared to the large molecules of the polymer suppressors of the present invention and are electroactive. Polymer suppressor molecules are large molecules and once adsorbed onto nucleation sites, are not easily desorbed. Because the adsorption efficiency of the accelerator is greater than that of the suppressor, deposition is greater where adsorption of the accelerator is greater. Further, when an accelerator molecule and a suppressor molecule compete for a site of nucleation, the accelerator dominates. It is further hypothesized that, during electrodeposition, current flows to the areas of least resistance, which is the areas of the features. The accelerator molecules, being electroactive, thus may be attracted to the features, thereby accelerating deposition in the features. It is also hypothesized that, in electrochemical mechanical deposition, where a contact surface moves the composition around the surface of the work piece, the smaller, more mobile accelerator molecules are more likely to be moved into the features, leaving the suppressor molecules adsorbed on the fields.

In accordance with a further exemplary embodiment of the invention, the accelerator may also be formulated so that it lowers the energy barrier required to cause deposition of the copper on the work piece. The accelerator may serve as a complexing agent that forms stable complexes with the copper. While copper may deposit on the work piece at a standard reduction potential, the copper may form a complex with the accelerator and have a reduction potential less than the standard reduction potential. Thus, less electricity may be required during the electrodeposition process to break the bonds of the accelerator/copper complex and deposit the copper onto the work piece. Alternatively, an accelerator can be selected so that an accelerator/copper complex is formed requiring a particular reduction potential. Depending on the value of this reduction potential, the amount and length of current supplied to the electrodeposition process can be varied so that the copper is deposited in varying grain size. For example, when current is supplied at 3 amps for 60 seconds, copper of a first grain size will be deposited and when the current is then changed to 6 amps for 30 seconds, copper of a second grain size will be deposited.

Suitable accelerators in accordance with the various embodiments of the present invention comprise compounds that contain one or more sulfur atoms and have a molecular weight of about 1000 or less. In one exemplary embodiment of the invention, the accelerators may comprise compounds having an —S—S— moiety. In another exemplary embodiment, the accelerators may comprise compounds having the formula H—S—R, where R is an electron-donating group that may increase electron density on the sulfur atom and impart stability to the accelerator anion that is created in solution. Examples of the R group comprise:

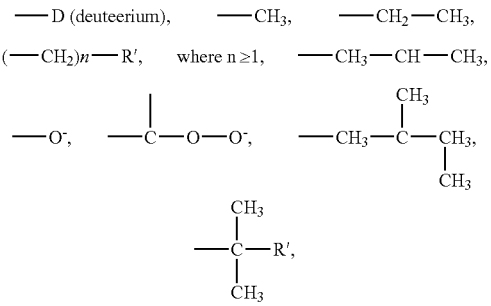

where R" is any electron-donating group. Other examples of the R group may comprise:

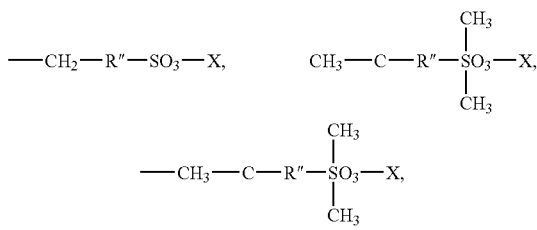

where R" is an optionally substituted alkyl group and X is a counter ion such as sodium or potassium. In an exemplary embodiment of the invention, the accelerator comprises dipropyl disulfide, tert-butyl disulfide, 3,3-dithiodipropionic acid, a metal salt of 2-mercaptoethane sulfonic acid (HS—$(CH_2)_2$—$SO_3$-M) or 3-mercaptopropane sulfonic acid (HS—$(CH_2)_2$—$CH_2$—$SO_3$-M), where the metal salt may comprise sodium, potassium, ammonium, and the like.

A variety of copper salts may be employed in electrodeposition composition as a source of copper ions, including, for example, copper sulfates, copper acetates, copper fluoroborate, and cupric nitrates. A copper salt may be suitably present in a relatively wide concentration range in the electrodeposition composition. Preferably, a copper salt will be employed at a concentration of from about 10 to about 300 grams/liter of composition.

Figure 3:
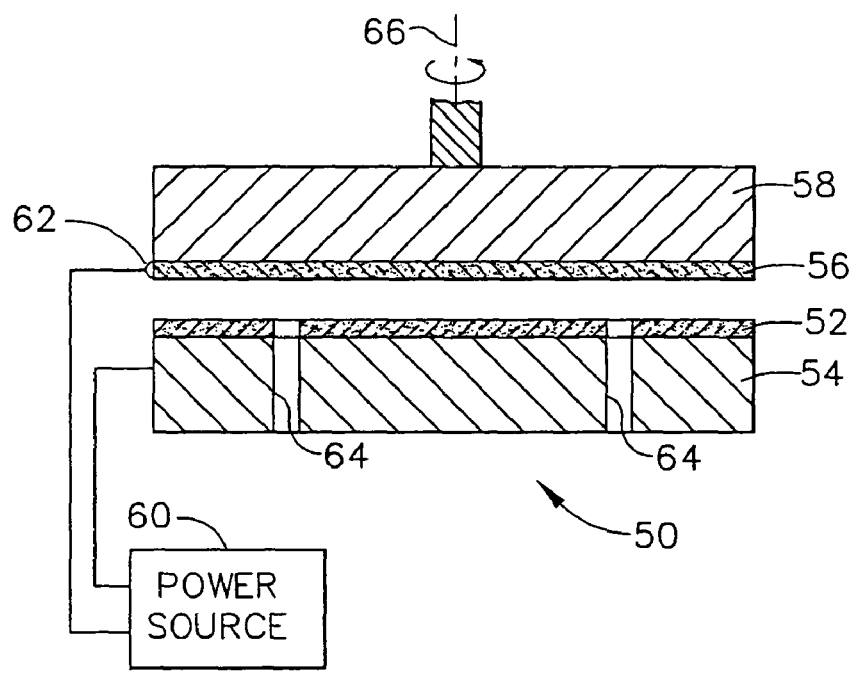
FIG. 3 is a cross-sectional view of an exemplary electrodeposition apparatus.

The following example illustrates a method, in accordance with one embodiment of the invention, for performing electrodeposition, in particular, substantially planar deposition, of copper on a work piece having a noble metal barrier layer. The electrodeposition composition of the present invention may be used in a variety of deposition apparatus known in the industry. For purposes of this example, use of the composition of the present invention during an electrochemical mechanical deposition process will be described. A schematic representation of an electrochemical mechanical deposition apparatus 50 is illustrated in FIG. 3. To effect substantially planar electrochemical deposition, apparatus 50 utilizes a contact surface 52 supported by a platen 54. A work piece 56, such as a semiconductor wafer, may be urged against contact surface 52 by a wafer carrier assembly 58.

Work piece 56 has formed on a surface thereof a noble metal barrier layer, which, for purposes of this example, comprises a ruthenium barrier layer. Platen 54 may be fabricated from a conductive material, such as copper, tantalum, gold or platinum or may be formed of an inexpensive material, such as aluminum or titanium, and coated with a conductive material. Using a power source 60, the apparatus applies a negative potential to the work piece 56, via a cathode contact 62, and a positive potential to the platen 54, which acts as an anode. The cathode contact 62 may comprise one or more contacts and may contact work piece 56 by a variety of methods. For example, contact(s) 62 may be insulated and disposed within platen 54 to contact the face of work piece 56 or may be remote from platen 54 and may contact the face of work piece 56 at its edges.

Platen 54 may be connected to a driver or motor assembly (not shown) that is operative to rotate platen 54 and contact surface 52 about a vertical axis. It will be appreciated, however, that the driver or motor assembly may be operative to move platen 54 and contact surface 52 in an orbital, linear or oscillatory pattern or any combination thereof Similarly, wafer carrier 58 may be connected to a driver or motor assembly (not shown) that is operative to rotate wafer carrier 58 and work piece 56 about a vertical axis or to move wafer carrier 58 and work piece 56 in an orbital, linear or oscillator pattern or any combination thereof.

Platen 54 may have one or more channels 64 for the transportation of the electrodeposition composition of the present invention to the surface of the contact surface 52 from a manifold apparatus (not shown) or any suitable distribution system. Alternatively, it will be appreciated that the composition of the present invention may be deposited directly on or through the contact surface 52 by a conduit or any suitable application mechanism.

In one exemplary embodiment of the invention, the method for electrodeposition of copper on at least a portion of the ruthenium barrier layer comprises selecting an electrodeposition temperature, that is, the predominant or average temperature at which the electrodeposition process will be conducted. An electrodeposition composition comprising a metal salt, a suppressor, an accelerator, and an electrolyte is utilized. In one exemplary embodiment, the suppressor may be selected so that it has a cloud point that is no greater than the deposition temperature. In a preferred embodiment of the invention, the suppressor is selected so that the cloud point matches the deposition temperature. If the cloud point is greater than the deposition temperature, an anion may be added to the composition to lower the cloud point to a temperature no greater than the electrodeposition temperature. In this example, for a deposition temperature of 21° C., the composition may comprise 67 g/L $CuSO_4.5H_2O$, 180 g/L $H_2SO_4$, 10 ml/L of 2% Pluronic® 31R1, 7 ml/L of 0.1% of the sodium salt of 3-mercaptopropane sulfonic acid and 50 ppm bromide. The components of the composition may be combined in any suitable order by any convenient method of mixing, such as, for example, by rapidly stirring with a mechanical stirrer or by agitating with a mechanical agitator.

Next, copper is electrodeposited onto at least a portion of the ruthenium barrier layer from the electrodeposition composition. The electrodeposition occurs at the selected electrodeposition temperature. Wafer carrier 58 urges work piece 56 against contact surface 52 such that work piece 56 engages contact surface 52 at a desired pressure. Preferably, wafer carrier 58 applies a uniform and constant pressure of approximately 1 psi or less, although it may be appreciated that any suitable pressure that promotes substantially planar deposition may be used. During the deposition process, the electrodeposition composition is delivered to the surface of contact surface 52 through channels 64. A low current density is also applied to create a circuit between platen 54, the electrodeposition composition and work piece 56. The power source 60 may apply a constant current or voltage to the apparatus or, alternatively, the current or voltage could be modulated to apply different currents or voltages at predetermined times in the process or to modulate between a predetermined current or voltage and no current or no voltage. Wafer carrier 58 and work piece 56 may rotate about an axis 66 while platen 54 and contact surface 52 move in a rotational, orbital or linear pattern. In addition, wafer carrier 58 and work piece 56 may oscillate relative to contact surface 52. The electrodeposition process continues for a predetermined amount of time or a desired deposition thickness has been achieved.

Thus, as illustrated and described above, a thin noble metal barrier layer, that is, no greater than 400 angstroms, preferably no greater than 100 angstroms, may be deposited on a work piece, followed by the electrodeposition of a thin copper metallization layer, preferably no greater than 3000 angstroms thereon, using various embodiments of the methods of the present invention. In this manner, to the extent that there is overburden deposited overlying the field regions of the work piece, the overburden of the entire metal layer (barrier layer and metallization layer) may be substantially thinner than the overburden resulting from conventional electrodeposition processes. Accordingly, the time consumed in subsequent processing steps, such as CMP, wet etching, reverse polarity etching and the like, to remove the overburden may be significantly reduced or eliminated altogether.

Figure 4:
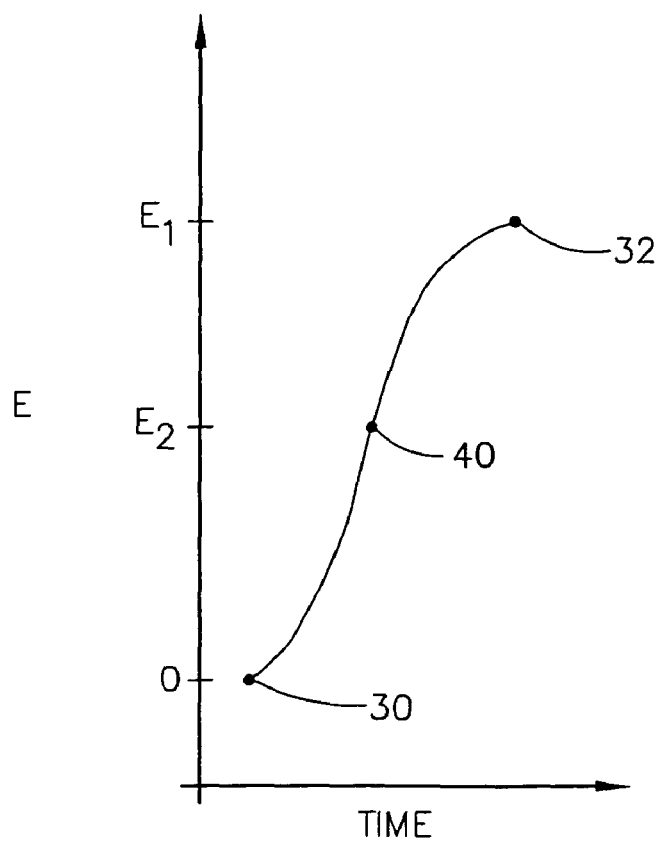
FIG. 4 is a graph illustrating the change in the electronic energy of the surface of the noble metal layer upon deposition of a copper seed layer overlying the noble metal layer.

In accordance with another embodiment of the present invention, the electronic energy of the noble metal barrier layer may be modified for copper electrodeposition by forming a copper seed layer overlying at least a portion of the noble metal barrier layer. After formation of the copper seed layer, a copper metallization layer may be deposited using electrodeposition. FIG. 4 is a graph that qualitatively illustrates the change in the electronic energy of the surface of the noble metal to accomplish copper deposition using the formation of a copper seed layer. At point 30, the electronic energy of the noble metal barrier layer is at its elemental state and copper deposition does not occur. At point 32, the noble metal barrier layer has an electronic energy state of $E_1$, at which point copper deposits on the noble metal layer. At point 40, upon formation of a copper seed layer overlying the noble metal barrier layer, the noble barrier layer has an electronic energy state of $E_2$, which is less than $E_1$ but which is greater than zero. Accordingly, by forming a seed layer of copper overlying at least a portion of the noble metal barrier layer, the electronic energy of the noble metal barrier layer is increased to an amount that will permit a copper metallization layer to deposit overlying the copper seed layer upon the application of a suitable low current density during electrodeposition.

In one exemplary embodiment of the present invention the copper seed layer may be formed by electroless deposition. Electroless deposition typically involves the deposition of copper from an electroless deposition solution comprising copper ions ($Cu^{2+}$ and/or $Cu^+$), a complexing agent and a reducing agent. In one embodiment of the present invention, the concentration of the copper ions is in a range of from 0.001 to about 5.0M. In a preferred embodiment of the invention, the concentration of the copper ions is in a range of from 0.01 to about 1.0M. The electroless deposition solution also may contain a variety of other components, such as the accelerator, suppressor, and/or anions described above. The electroless deposition may be conducted at a temperature in the range of from about 20 to about 100° C. In a preferred embodiment of the invention, the electroless deposition is conducted at a temperature in the range of from about 40 to about 90° C. and, in a more preferred embodiment of the invention, the electroless deposition is conducted at a temperature in the range of from about 65 to about 85° C.

The complexing agent is a constituent that suitably forms a stable Cu(II) or Cu(I) complex with the copper ions during a complexation reaction. Examples of complexing agents suitable for use during the electroless deposition described above include ethylenediaminetetraacetic acid (EDTA), triethylenetetraamine (TETA), diethylenetriamine, and 1,2 diaminocyclohexanetetraacetic acid. It will be appreciated that more than one complexing agent may be used during the electroless deposition of the present invention.

The reducing agent is a constituent that is oxidized during electroless deposition and, thus, serves to provide the copper ions of the copper complex with electrons so that the copper deposits out of solution. Preferably, the reducing agent is an organic reducing agent. Examples of reducing agents suitable for use during electroless deposition of the present invention include, but are not limited to, glycolic acid, glyoxal, sugars, alcohols, polyhydroxy acids, and polyhydroxy aldehydes. In one exemplary embodiment of the invention, the reducing agent may be selected depending on the standard reduction potential for the copper complexation reaction. Typically, the standard reduction potentials for copper complexation reactions are greater than 0.337 V. The standard reduction potential for copper complexation with EDTA is approximately 0.557V and the standard reduction potential for copper complexation with TETA is approximately 0.597 V. The stronger the complexing agent, that is, the higher the standard reduction potential for the copper complexation reaction, the stronger the reducing agent may be. For example, if EDTA is used as the complexing agent, formaldehyde or glyoxylic acid, each having one reducing moiety, may be used. In contrast, if TETA is used as the complexing agent, a stronger reducing agent, such as glyoxal having two reducing moieties, may be used. It will be appreciated that more than one reducing agent may be used during the electroless deposition of the present invention. The concentration of the reducing agent(s) may be in the range of about 0.001 to about 20.0M. In a preferred embodiment of the invention, the reducing agent(s) may be in the range of about 0.01 to about 5.0M.

The pH of the electroless deposition solution may be in the range of about 1 to 14. In a preferred embodiment of the present invention, the pH of the electroless deposition solution may be in the range of about 10-14. In a more preferred embodiment of the present invention, the pH of the electroless deposition solution may be in the range of about 11-13. The electroless deposition solution may include pH-adjusting agents to adjust the pH of the solution to a desired level. Suitable pH adjusting agents may include tetramethylammonium hydroxide, potassium hydroxide and sodium hydroxide. Preferably, the pH adjusting agent(s) is an organic compound so that contamination of the deposited copper layer by metal-containing pH adjusting agents is avoided.

In one exemplary embodiment of the invention, the electroless deposition is performed by adding the reducing agent dropwise to the electroless deposition solution containing at least the copper ions and the complexing agent. In another exemplary embodiment of the invention, the electroless deposition is performed in a relatively high supersaturation of reducing agent. The supersaturation is achieved by adding all at once an amount of the reducing agent suitable for achieving supersaturation in the electroless deposition solution. Using this method a relatively thin copper metallization layer, that is, less than or equal to about 3000 angstroms may be achieved. In another exemplary embodiment of the invention, the electroless deposition is performed in a relatively low supersaturation of reducing agent. In this embodiment, the supersaturation is achieved by adding drop wise an amount of the reducing agent suitable for achieving supersaturation. Using this method, a relatively thick copper metallization layer, that is, greater than about 3000 angstroms, may be achieved.

As described above, after electroless deposition of a copper seed layer overlying at least a portion of the noble metal barrier layer, the electronic energy of the noble metal barrier layer may be further modified for deposition of a copper metallization layer on the seed layer by subjecting the noble metal barrier layer to a current density, preferably a low current density, during electrodeposition. The electrodeposition may be conducted using conventional electrodeposition or, alternatively, may be conducted using the electrodeposition composition described above.

In another exemplary embodiment of the present invention, the copper seed layer may be formed overlying the noble metal barrier layer by subjecting the noble metal barrier layer to a low current density in the presence of the electrodeposition composition described above. After deposition of the copper seed layer overlying at least a portion of the noble metal barrier layer, the electronic energy of the noble metal barrier layer may be further modified for deposition of a copper metallization layer on the seed layer by subjecting the noble metal barrier layer to a current density, preferably a low current density, during electrodeposition. The electrodeposition may be conducted using conventional electrodeposition or, alternatively, may be conducted using the electrodeposition composition described above.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for electrodeposition of copper on a noble metal layer of a work piece, the method comprising the steps of:

selecting an electrodeposition temperature;

exposing the noble metal layer to an electrodeposition composition, said electrodeposition composition comprising a copper salt, a suppressor, an accelerator and an electrolyte, wherein said suppressor has a cloud point that is no less than said electrodeposition temperature, and wherein said electrodeposition composition further comprises an anion present in an amount sufficient to lower said cloud point to a temperature approximately no greater than said electrodeposition temperature if said cloud point is greater than said electrodeposition temperature;

initiating electrodeposition of copper on a surface of the noble metal layer by application of a predetermined current density to the work piece; and terminating said initiating electrodeposition upon the occurrence of a predetermined event.

2. The method of claim 1, the step of initiating electrodeposition of copper comprising subjecting said noble metal layer to a current density no greater than 40 mAmps/cm$^2$.

3. The method of claim 2, the step of initiating electrodeposition of copper comprising subjecting said noble metal layer to a current density no greater than 20 mAmps/cm$^2$.

4. The method of claim 1, the step of initiating electrodeposition of copper comprising subjecting said noble metal layer to at least one of a constant current, a constant voltage, a modulated current and a modulated voltage.

5. The method of claim 1, the step of exposing the noble metal layer to said electrodeposition composition comprising exposing to said electrodeposition composition a layer of at least one of ruthenium, rhodium, palladium, osmium, iridium and platinum.

6. The method of claim 1, the step of exposing comprising exposing the noble metal layer to said electrodeposition composition having at least one anion selected from the group comprising chloride ions, bromide ions, iodide ions and sulfate ions.

7. The method of claim 1, the step of exposing comprising exposing the noble metal layer to said electrodeposition composition having said suppressor formulated so that said cloud point matches said electrodeposition temperature.

8. The method of claim 1, the work piece having a feature and a field region and the step of exposing comprising exposing the noble metal layer to said electrodeposition composition that is formulated so that, upon the step of initiating electrodeposition of copper, the rate of deposition of the copper within said feature is greater than the rate of deposition of the copper on said field region.

9. The method of claim 1, wherein the work piece has a first field region adjacent a feature having a dimension of at least 2 µm and has a second field region adjacent a feature having a dimension of less than 2 µm, and wherein the step of exposing comprises exposing the noble metal layer to said electrodeposition composition formulated so that said suppressor exhibits preferential adsorption on said first and said second field regions.

10. The method of claim 1, the step of exposing comprising exposing the noble metal layer to said electrodeposition composition having said suppressor that comprises a wetting agent.

11. The method of claim 1, the step of exposing comprising exposing the noble metal layer to said electrodeposition composition having said suppressor comprising a block copolymer of ethylene oxide and propylene oxide.

12. The method of claim 1, the work piece having a first feature with a dimension of at least 2 µm wide and having a second feature with a dimension of less than 2 µm, wherein the step of exposing comprises exposing the noble metal layer to said electrodeposition composition formulated so that said accelerator exhibits preferential adsorption within said first and said second features.

13. The method of claim 1, the step of exposing comprising exposing the noble metal layer to said electrodeposition composition having said accelerator comprising at least one sulfur atom.

14. The method of claim 1, the step of exposing comprising exposing the noble metal layer to said electrodeposition composition having said accelerator formed of one of a metal salt of 2-mercaptoethane sulfonic acid and a metal salt of 3-mercaptopropane sulfonic acid.

15. The method of claim 1, the method of electrodeposition comprising a method for electroplating.

16. The method of claim 1, the method of electrodeposition comprising a method for electrochemical mechanical deposition.

17. The method of claim 1, wherein the step of initiating electrodeposition of copper results in the deposition of a copper metallization layer on the work piece and the step of terminating comprises terminating the step of initiating electrodeposition of copper when said copper metallization layer has a thickness in the range of about 500 to about 3000 angstroms.

* * * * *